(12) United States Patent
Fujihara et al.

(10) Patent No.: US 11,307,223 B2
(45) Date of Patent: Apr. 19, 2022

(54) INSPECTION DEVICE AND METHOD OF CONTROLLING TEMPERATURE OF PROBE CARD

(71) Applicant: TOKYO ELECTRON LIMITED, Tokyo (JP)

(72) Inventors: Jun Fujihara, Yamanashi (JP); Jun Mochizuki, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 51 days.

(21) Appl. No.: 16/842,561

(22) Filed: Apr. 7, 2020

(65) Prior Publication Data
US 2020/0341031 A1 Oct. 29, 2020

(30) Foreign Application Priority Data

Apr. 25, 2019 (JP) .............................. JP2019-084066
Aug. 29, 2019 (JP) .............................. JP2019-156793

(51) Int. Cl.
*G01R 1/44* (2006.01)
*G01R 31/28* (2006.01)
*G01R 1/073* (2006.01)

(52) U.S. Cl.
CPC ........... *G01R 1/44* (2013.01); *G01R 1/07342* (2013.01); *G01R 31/2831* (2013.01)

(58) Field of Classification Search
None
See application file for complete search history.

(56) References Cited

U.S. PATENT DOCUMENTS

| 8,680,880 B2 * | 3/2014 | Kiyofuji | ............ | G01R 31/2875 |
| | | | | 324/754.01 |
| 2017/0146632 A1 * | 5/2017 | Wadell | ................. | G01R 35/005 |

FOREIGN PATENT DOCUMENTS

| JP | 2000-138268 A | | 5/2000 | | |
| WO | WO-2004023548 A1 * | | 3/2004 | ......... | G01R 1/07314 |

OTHER PUBLICATIONS

Machine English Translation of WO2004/023548 to Abe et al. (Year: 2004).*

* cited by examiner

*Primary Examiner* — Douglas X Rodriguez
(74) *Attorney, Agent, or Firm* — Fenwick & West LLP

(57) ABSTRACT

An inspection device for inspecting an inspection target substrate includes a probe card, a tester, a plurality of conductive lines, and a resistor. The probe card has probes to be in contact with the inspection target substrate. The tester is configured to transmit and receive electric signals for an inspection to and from the inspection target substrate through the probes. The conductive lines electrically connect the probe card with the tester, and at least a part of the conductive lines is electrically connected to the probes. The resistor is formed at the probe card and serves as an electrical resistor. The tester is further configured to measure a resistance of the resistor based on the electric signals transmitted and received through the conductive lines.

11 Claims, 8 Drawing Sheets

INSPECTION DEVICE AND METHOD OF CONTROLLING TEMPERATURE OF PROBE CARD

CROSS-REFERENCE TO RELATED APPLICATIONS

This application claims priority to Japanese Patent Application Nos. 2019-084066 and 2019-156793, respectively filed on Apr. 25, 2019 and Aug. 29, 2019, the entire contents of which are incorporated herein by reference.

TECHNICAL FIELD

The present disclosure relates to an inspection device and a method of controlling the temperature of a probe card.

BACKGROUND

Japanese Patent Application Publication No. 2000-138268 discloses an inspection device for performing an inspection by bringing probes of a probe card into contact with a semiconductor circuit formed on a surface of a wafer while heating the wafer from the backside of the wafer. This inspection device includes a support for fixing the wafer, a first heater for heating the wafer on the support, and a second heater for heating a surface of the probe card, the surface not being in contact with the wafer. Further, the aforementioned Publication discloses a technique for controlling a driving circuit of the second heater such that a temperature difference between two opposite surfaces of the probe card is reduced based on a measurement result obtained using thermocouples attached to the two opposite surfaces of the probe card.

The technique of the present disclosure can determine, even when a probe card has multiple probes, whether or not tip ends of the probes are positionally stable during a preliminary temperature control of the probe card.

SUMMARY

In accordance with an aspect of the present disclosure, there is provided an inspection device for inspecting an inspection target substrate, including: a probe card having probes to be in contact with the inspection target substrate; a tester configured to transmit and receive electric signals for an inspection to and from the inspection target substrate through the probes; a plurality of conductive lines that electrically connect the probe card with the tester, at least a part of the conductive lines being electrically connected to the probes; and at least one resistor formed at the probe card and serving as an electrical resistor. The tester is further configured to measure a resistance of the at least one resistor based on the electric signals transmitted and received through the conductive lines.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
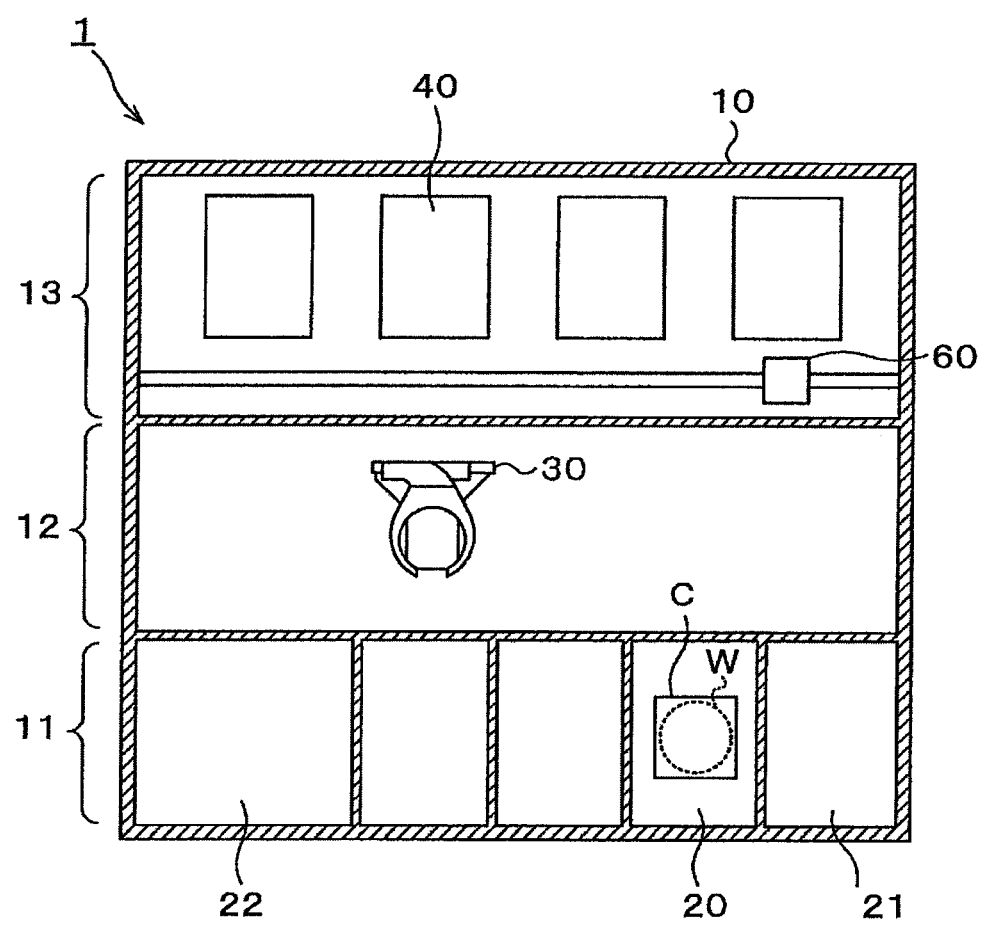
FIG. 1 is a horizontal cross-sectional view schematically showing a configuration of an inspection device according to an embodiment.

In a semiconductor manufacturing process, a plurality of semiconductor devices having a circuit pattern is formed on a semiconductor wafer (hereinafter, referred to as "wafer"). The electrical characteristics of the formed semiconductor devices are inspected and the semiconductor devices are classified into non-defective products or defective products based on the inspection result. For example, in inspecting the the semiconductor devices, the wafer is inspected by using an inspection device before the wafer is divided into the semiconductor devices.

The inspection device includes a mounting table for mounting thereon a wafer and a probe card having multiple probes. In order to perform the electrical characteristic inspection, first, the wafer mounted on the mounting table and the probe card are made to be close to each other and, then, the probes of the probe card are brought into contact with electrodes of the semiconductor devices formed on the wafer. In this state, a tester disposed above the probe card supplies electric signals to the semiconductor devices through the probes. Whether or not the semiconductor devices are defective is determined based on the electric signals transmitted from the semiconductor devices through the probes to the tester.

Recently, in the case of inspecting the electrical characteristics of the semiconductor devices, the temperature of the mounting table is controlled by a coolant flow path and a heater disposed in the mounting table in order to reproduce an installation environment of the semiconductor devices. Accordingly, the temperature of the wafer mounted on the mounting table can be controlled.

In the case of inspecting electrical characteristics of electronic devices at a high temperature or a low temperature, the wafer is thermally expanded or contracted. The heat from the wafer is transferred to the probe card having the probes, so that the probe card is also thermally expanded or contracted. However, due to a difference in thermal expansion coefficients therebetween, the relative positions of the semiconductor devices and the probes are different between a normal temperature and a high/low temperature. Therefore, it is difficult to accurately perform the electrical characteristic inspection at a high/low temperature.

Therefore, the temperature of the probe card may be controlled before the electrical characteristic inspection (hereinafter, referred to as "preliminary temperature control"). In the preliminary temperature control of the probe card, the pre-heated mounting table is made to be close to the probes and the probes are heated until the tip ends of the probes are positionally stable.

The preliminary temperature control of the probe card requires a long period of time depending on control methods and types of the probe card.

In a conventional case, an inspection device does not have the function of detecting whether or not the tip ends of the probes are positionally stable. Therefore, the preliminary temperature control requires a sufficient amount of time to be completely performed. In this case, however, the preliminary temperature control requires a longer period of time, decreasing the inspection throughput.

By providing thermocouples at the probe card as in the inspection device disclosed in the aforementioned Publication, it is possible to determine whether or not the temperature of the probe card is stable and if the tip ends of the probes are positionally stable based on the measurement result obtained using the thermocouples. However, when multiple probes are disposed on the bottom surface of the probe card, it is not possible to provide the thermocouples on the bottom surface of the probe card. Further, when multiple probes are disposed on the bottom surface of the probe card, electrode pads are disposed on the top surface of the probe card to correspond to the probes. Thus, it is not possible to provide the thermocouples on the top surface of the probe card. In addition, in the case of an inspection device in which a probe card is attracted and held from the top in the inspection device, the probe card and a member disposed directly above the probe card are very close to each other. Therefore, it is difficult to provide the thermocouples on the top surface of the probe card.

Therefore, the technique of the present disclosure can determine, even when the probe card has multiple probes, whether or not the tip ends of the probes are positionally stable during the preliminary temperature control of the probe card.

Hereinafter, an inspection device and a method of controlling a temperature of a probe card according to the present embodiment will be described with reference to the accompanying drawings. Like reference numerals will be given to like parts having substantially the same functions and configurations throughout the specification, and the drawings and redundant description thereof will be omitted.

Figure 2:
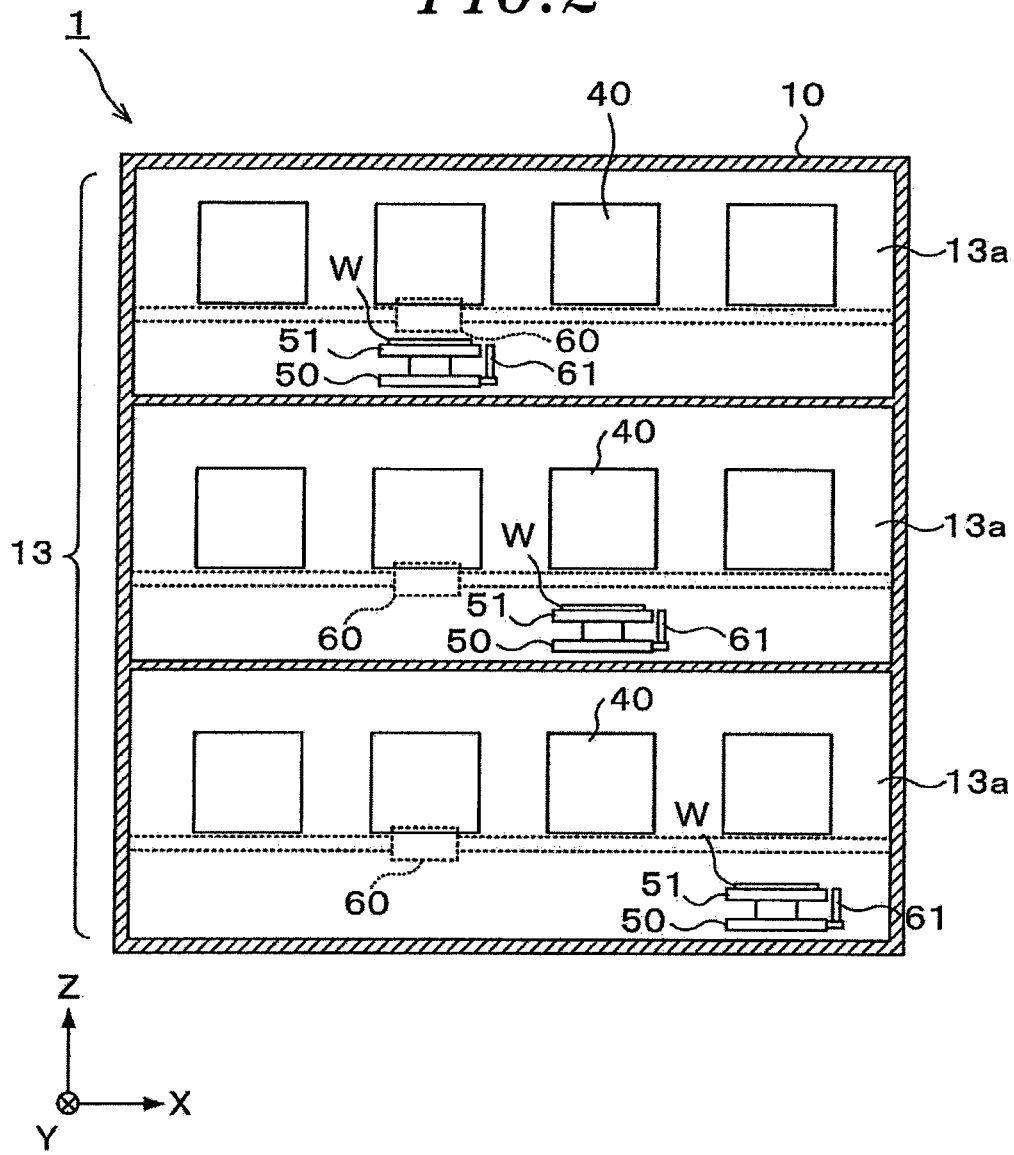
FIG. 2 is a vertical cross-sectional view schematically showing the configuration of the inspection device according to the embodiment.

FIGS. 1 and 2 are a horizontal cross-sectional view and a vertical cross-sectional view, each schematically showing a configuration of the inspection device of the present embodiment.

As shown in FIGS. 1 and 2, the inspection device 1 includes a housing 10 having a loading/unloading area 11, a transfer area 12, and an inspection area 13. In the loading/unloading area 11, the wafer W as an inspection target substrate is loaded into and unloaded from the inspection device 1. The transfer area 12 connects the loading/unloading area 11 and the inspection area 13. In the inspection area 13, electrical characteristics of semiconductor devices that are inspection target devices formed on the wafer W are inspected.

The loading/unloading area 11 has therein a port 20 for receiving a cassette C containing a plurality of wafers W, a loader 21 accommodating a probe card to be described later, and a controller 22 for controlling respective components of the inspection device 1. The controller 22 is, e.g., a computer having a CPU, a memory, and the like, and includes a program storage unit (not shown). The program storage unit stores programs for controlling various processes in the inspection device 1. The programs may be recorded in a computer-readable storage medium and installed in the controller 22 from the storage medium. A part or all of the programs may be realized by a dedicated hardware (circuit board).

A transfer unit 30 that is movable while holding, for example, the wafer W is disposed in the transfer area 12. The transfer unit 30 transfers the wafer W between the cassette C in the port 20 of the loading unloading area 11 and the inspection area 13. Further, the transfer unit 30 transfers a probe card requiring maintenance among probe cards fixed to pogo frames 70 (see FIG. 4) in the inspection area 13 to the loader 21 in the loading/unloading area 11. In addition, the transfer unit 30 transfers a new probe card or a probe card that has been subjected to maintenance from the loader 21 to the pogo frame 70 in the inspection area 13.

A plurality of testers 40 is disposed in the inspection area 13. Specifically, as shown in FIG. 2, the inspection area 13 is vertically divided into three areas 13, and four testers 40 are horizontally arranged in a row (X direction in FIG. 2) in each area 13a. One aligner 50 and one camera 60 are disposed in each area 13a. The number and arrangement of the testers 40, the number and arrangement of the aligner 50, and the number and arrangement of the camera 60 may be randomly selected.

Each of the testers 40 transmits and receives electric signals for electrical characteristic inspection to and from the wafer W.

The aligner 50 moves a chuck top 51 to be described later serving as a mounting table for mounting thereon the wafer W. The aligner 50 on which the chuck top 51 is mounted is movable below the tester 40. Specifically, the aligner 50 is movable in a vertical direction (Z direction in FIG. 2), a forward-backward direction (Y direction in FIG. 2), and a right-left direction (X direction in FIG. 2). Therefore, the aligner 50 serves as a position adjusting mechanism for adjusting the position between the chuck top 51 and the probe card. Further, the aligner 50 can detachably hold the chuck top 51 by vacuum attraction force or the like and is provided with a camera 61 for capturing an image of the probe card.

The camera 60 moves horizontally and reaches a position in front of each tester 40 in the area 13a where the camera 60 is disposed so as to capture an image of the wafer W mounted on the chuck top 51 on the aligner 50.

The position alignment of the probes of the probe card with the electrode pads of the semiconductor devices formed on the wafer W can be performed by the cooperative operation of the cameras 60 and 61.

In the inspection device 1, while the transfer unit 30 is transferring the wafer W toward one tester 40, another tester 40 can inspect the electrical characteristics of the electronic devices formed on another wafer W.

Figure 3:
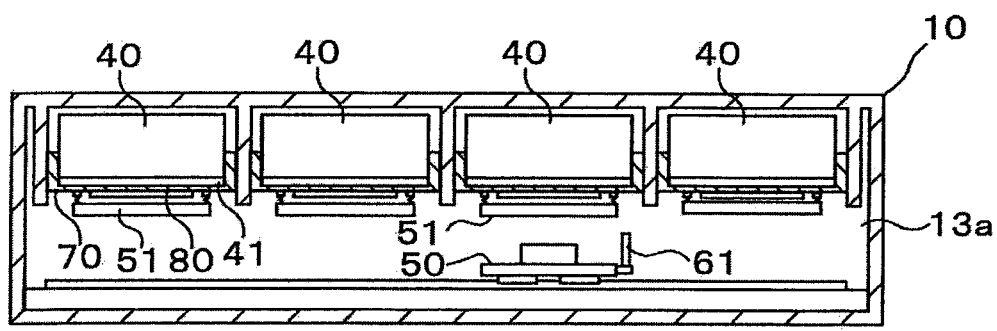
FIG. 3 is a vertical cross-sectional view showing a configuration in a divided area.
Figure 4:
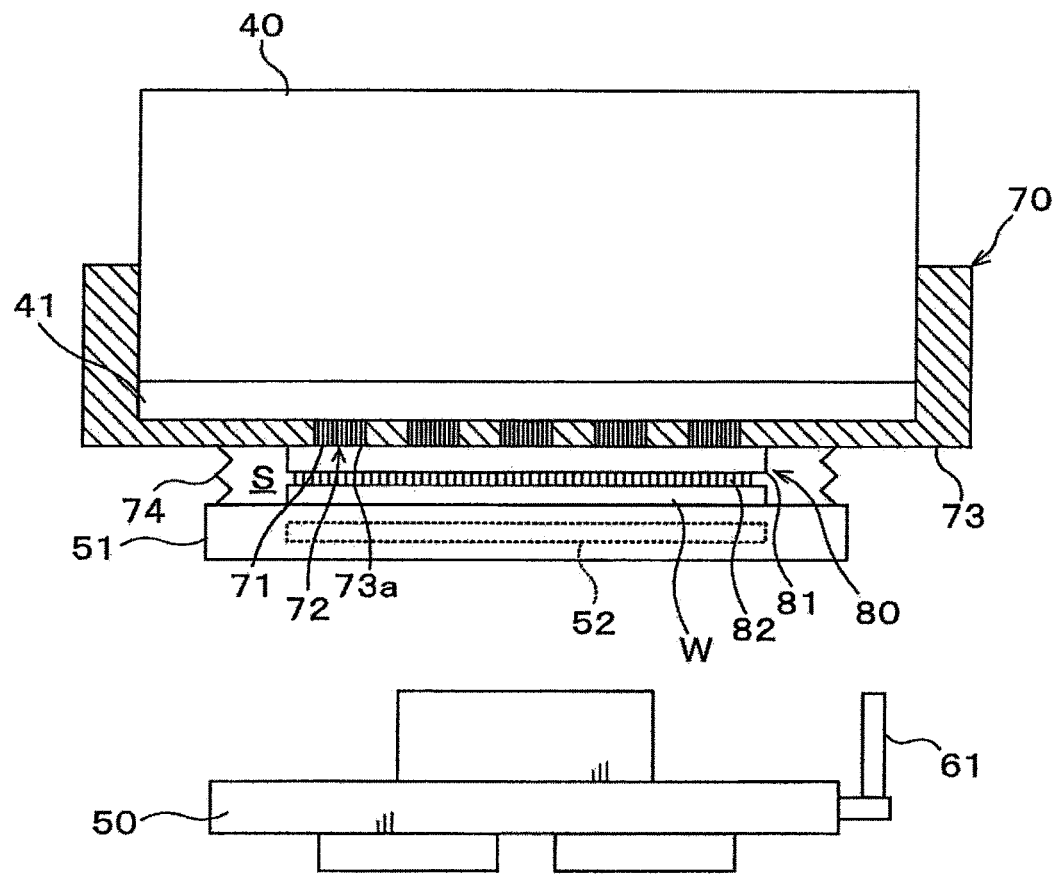
FIG. 4 is a partially enlarged view of FIG. 3.
Figure 5:
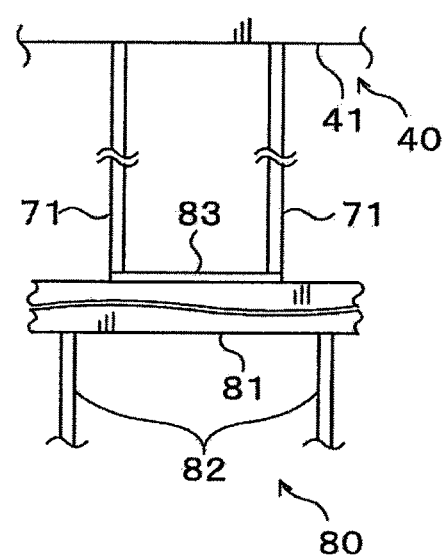
FIG. 5 is a partially enlarged side view showing a configuration around a probe card disposed below a tester.

Next, a configuration around each tester 40 will be described with reference to FIGS. 3 to 5. FIG. 3 is a vertical cross-sectional view showing a configuration in each area 13a. FIG. 4 is a partially enlarged view of FIG. 3. FIG. 5 is a partially enlarged view showing a configuration around the probe card disposed below the tester 40. In FIG. 5, the illustration of a pogo frame to be described later is omitted, and only pogo pins of a pogo block to be described later are illustrated.

As shown in FIGS. 3 and 4, the tester 40 has a tester motherboard 41 that is horizontally disposed on the bottom surface of the tester 40. A plurality of test circuit boards (not shown) is mounted upright on the tester motherboard 41. A plurality of electrodes is disposed at the bottom surface of the tester motherboard 41.

One pogo frame 70 and one probe card 80 are disposed below the tester 40, in that order, from the upper side.

The pogo frame 70 supports the probe card 80 and electrically connects the probe card 80 with the tester 40. The pogo frame 70 is disposed between the tester 40 and the probe card 80. The pogo frame 70 has multiple pogo pins 71 for electrically connecting the probe card 80 with the tester 40. Specifically, the pogo frame 70 has pogo blocks 72 holding the pogo pins 71. Further, the pogo frame 70 includes a frame main body 73 having insertion holes 73a into which the pogo blocks 72 holding the pogo pins 71 are inserted.

The probe card 80 whose position has been adjusted is supported on the bottom surface of the pogo frame 70.

A bellows 74 serving as a mounting table support capable of extending and contracting in a vertical direction is attached to the bottom surface of the pogo frame 70 to surround a position where the probe card 80 is attached. The bellows 74 is provided to form a sealed space including the probe card 80 and the wafer W in a state where the wafer W on the chuck top 51 to be described later is in contact with the probes 82 (to be described later) of the probe card 80 during the electrical characteristic inspection. The bellows 74 can also seal the space between the probe card 80 and the chuck top 51 during the preliminary temperature control of the probe card 80 or the like.

By using a gas exhaust unit (not shown), the tester motherboard 41 is coupled to the pogo frame 70 by vacuum attraction force and the probe card 80 is coupled to the pogo frame 70 by vacuum attraction force. Due to the vacuum attraction force, the lower ends of the pogo pins 71 of the pogo frame 70 are brought into contact with the corresponding electrode pads on the top surface of a card main body 81 (to be described later) of the probe card 80, and the upper ends of the pogo pins 71 are pressed against the corresponding electrodes on the bottom surface of the tester motherboard 41.

The probe card 80 includes the disc-shaped card main body 81 having multiple electrode pads on the top surface thereof and multiple probes (needle-shaped terminals) 82 extending downward from the bottom surface of the card main body 81.

The electrode pads disposed on the top surface of the card main body 81 are electrically connected to the corresponding probes 82. At the time of the inspection, the probes 82 are respectively brought into contact with the electrode pads or solder bumps of the semiconductor devices formed on the wafer W. Therefore, at the time of the electrical characteristic inspection, electric signals for the inspection are transmitted and received between the tester motherboard 41 and the semiconductor devices on the wafer W through the pogo pins 71, the electrodes on the top surface of the card main body 81, and the probes 82.

In the inspection device 1, the probes 82 are disposed to cover substantially the entire bottom surface of the card main body 81 in order to simultaneously inspect the electrical characteristics of the semiconductor devices formed on the wafer W.

The chuck top 51 is held below the probe card 80 through the bellows 74.

The wafer W is attracted and held on the chuck top 51. A temperature control mechanism 52 is embedded in the chuck top 51. The temperature control mechanism 52 is configured to control the temperature of the wafer W mounted on the chuck top 51 to be within a range of, e.g., −30° C. to +150° C., by controlling the temperature of the chuck top 51 at the time of the electrical characteristic inspection. The temperature control mechanism 52 includes an electric heater that generates heat by power, a coolant flow path through which a cooling medium flows, or a combination thereof.

At the time of the electrical characteristic inspection, the chuck top 51 on which the wafer W is mounted is raised by the aligner 50 and the probes 82 of the probe card 80 are brought into contact with the wafer W.

Further, at the time of the electrical characteristic inspection, by raising the chuck top 51, the bottom surface of the bellows 74 is brought into contact with the chuck top 51 through a sealing member (not shown) and an inspection space S defined by the chuck top 51, the pogo frame 70 and the bellows 74 becomes a sealed space. By evacuating the inspection space S, releasing the holding of the chuck top 51, and moving the aligner 50 downward, the chuck top 51 is separated from the aligner 50 and coupled to the pogo frame 70 by vacuum attraction force.

In the inspection device 1 including the above-described components, if the set temperature of the wafer W at the time of the electrical characteristic inspection is changed, the temperature control mechanism 52 embedded in the chuck top 51 performs the preliminary temperature control of the probe card 80 before the electrical characteristic inspection.

In order to determine whether or not the temperature of the probe card 80 is stable, i.e., whether or not the tip ends of the probes 82 are positionally stable during the preliminary temperature control, a short-circuit line 83 is formed as a resistor at the probe card 80 as shown in FIG. 5. The pogo pins 71 are conductive lines for electrically connecting the probe card 80 and the tester 40. The short-circuit line 83 is formed of a conductive pattern that electrically connects a pair of conductive lines, i.e., a pair of pogo pins 71 and serves as an electrical resistor between the pair of conductive lines, i.e., the pair of pogo pins 71. The conductive pattern forming the short-circuit line 83 is formed in a linear and thin film shape and made of the same material (e.g., a metal such as copper or the like) as that of the electrode pads to be in contact with the lower ends of the pogo pins 71. The short-circuit line 83 has a thickness of, e.g., several μm to several tens of μm. The short-circuit line 83 is formed, e.g., in the central area where the electrode pads are formed on the top surface of the card main body 81 of the probe card 80. The pair of pogo pins 71 that are short-circuited by the short-circuit line 83 are not electrically connected to the probes 82.

When the probe card 80 is extended and contracted during the preliminary temperature control, specifically, when the card main body 81 is extended and contracted during the preliminary temperature control, the short-circuit line 83 is also extended and contracted and the electrical resistance of the short-circuit line 83 is changed. When the temperature of the probe card 80 is changed during the preliminary temperature control, the temperature of the short-circuit line 83 is changed and, thus, the electrical resistance of the short-circuit line 83 that is temperature dependent is changed.

Therefore, in the inspection device 1, the tester 40 measures the electrical resistance of the short-circuit line 83 based on the electric signals transmitted through the pogo pins 71 that are short-circuited by the short-circuit line 83. Specifically, the tester 40 measures the electrical resistance between one ends of the pair of pogo pins 71 on the tester 40 side opposite to the other ends on the probe card 80 side that are short-circuited by the short-circuit line 83. Further, the tester 40 determines whether or not the temperature of the probe card 80 is stable and the tip ends of the probes 82 are positionally stable based on the electrical resistance measurement result. Further, a high-resistance conductor may be disposed in the short-circuit line 83 to make the electrical resistance of the short-circuit line 83 sensitively respond to temperature changes.

The short-circuit line 83 is formed in a thin conductive pattern that can be small enough when viewed from a plan view that the short-circuit line 83 can be formed at the probe card 80 even when the probe card 80 has the multiple probes 82.

Figure 6:
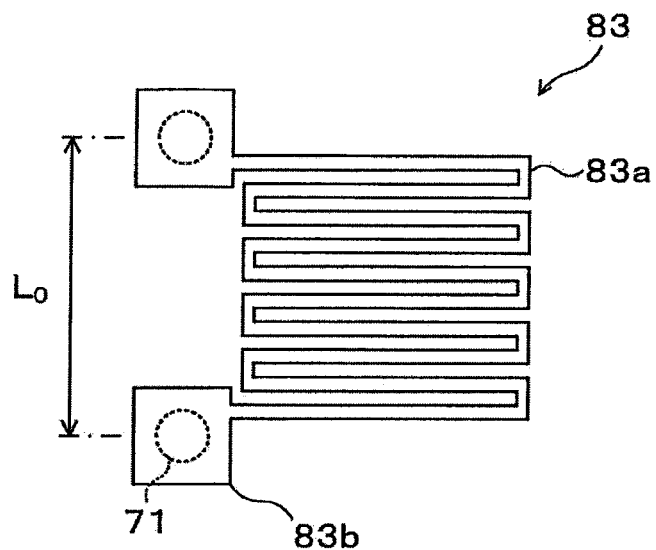
FIG. 6 is a plan view showing an example of a short-circuit line.
Figure 7:
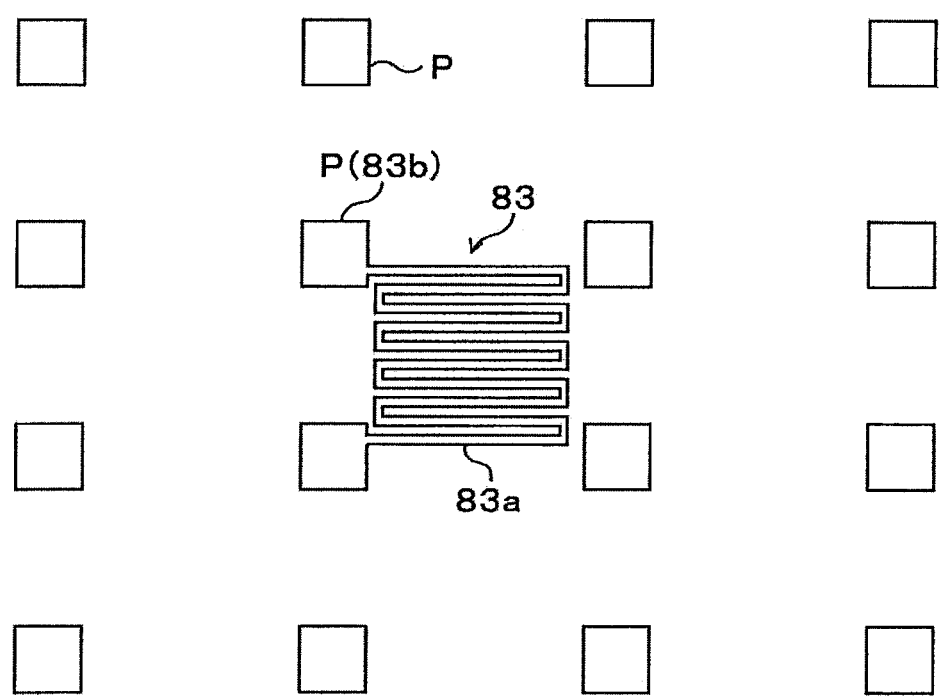
FIG. 7 is a plan view showing a configuration around the short-circuit line.

FIG. 6 is a plan view showing an example of the short-circuit line 83. FIG. 7 is a plan view showing a configuration around the short-circuit line 83.

As shown in FIG. 6, the length of the short-circuit line 83 is longer than a distance $L_0$ between the lower ends of the pogo pins 71. Specifically, the short-circuit line 83 has a folding pattern 83*a* that is repeatedly folded in the plan view so that the length of the short-circuit line 83 is longer than the distance $L_0$ between the lower ends of the pogo pins 71. The folding pattern (snaking pattern) 83*a* is repeatedly extended and folded in, e.g., a radial direction of the card main body 81 of the probe card 80. The dimension of the card main body 81 of the probe card 80 is considerably changed in the radial direction than in a circumferential direction during the preliminary temperature control. By repeatedly extending and folding the folding pattern 83*a* in the radial direction of the card main body 81 as described above, even if the temperature of the card main body 81 is slightly changed during the preliminary temperature control, the length of the short-circuit line 83 having the folding pattern 83*a* is considerably changed and the electrical resistance thereof is also considerably changed. Accordingly, the determination on whether or not the tip ends of the probes 82 are positionally stable based on the electrical resistance measurement result can be more accurately performed.

Further, both ends of the folding pattern 83*a* are connected to electrode pads 83*b* in contact with the lower ends of the pogo pins 71.

As shown in FIG. 7, the multiple electrode pads P are formed at regular intervals on the top surface of the card main body 81 of the probe card 80. The electrode pads P include those that are not electrically connected to the probe 82. The electrode pads P that are not electrically connected to the probe 82 are used as the electrode pads 83*b* of the short-circuit line 83.

Each of the electrode pads P has a dimension of, e.g., 0.6×0.6 mm in the plan view. The electrode pads P are formed at a pitch of, e.g., 3 mm. The folding pattern 83*a* is formed in, e.g., an area of 2×2 mm, in the plan view, and has a line width of, e.g., 0.1 mm.

Figure 8:
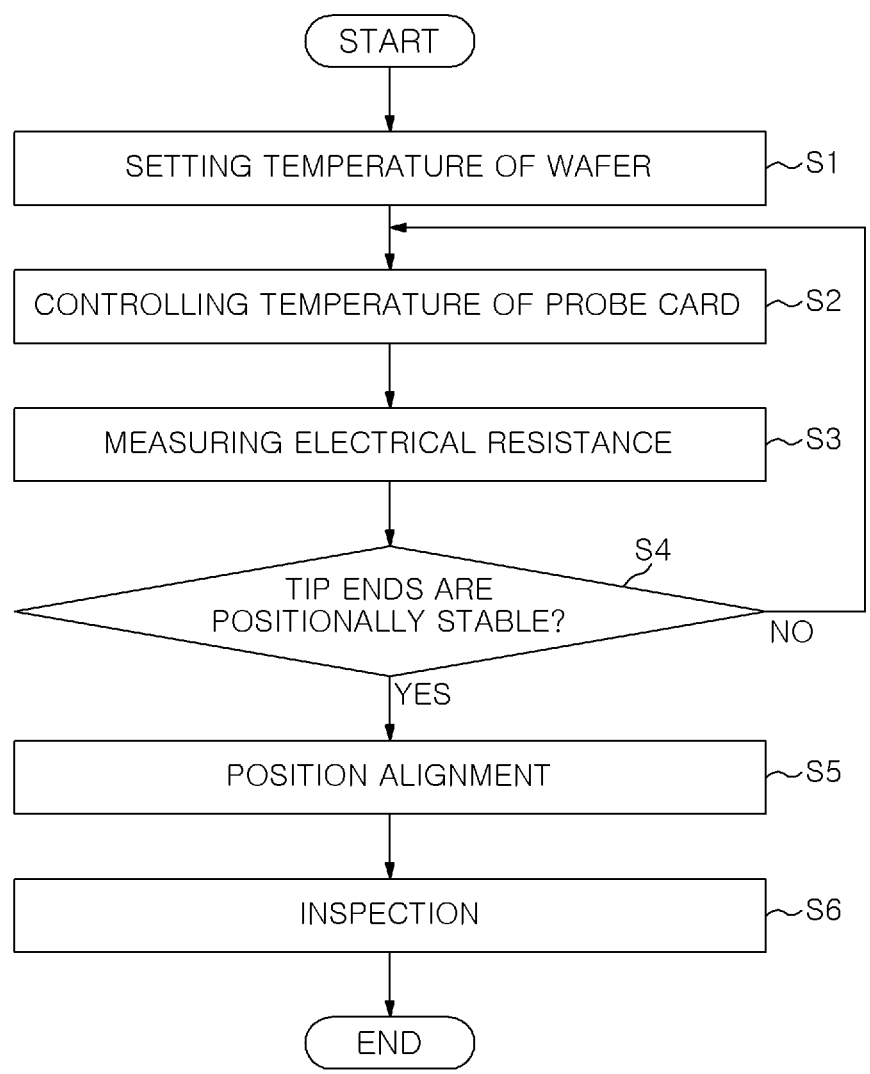
FIG. 8 is a flowchart for explaining an example of an inspection process using the inspection device.

Next, an inspection process using the inspection device 1 will be described with reference to FIG. 8. FIG. 8 is a flowchart for explaining an example of the inspection process. In the following description, it is assumed that the process is started in a state where the chuck tops 51 on each of which the wafer W is not mounted are coupled to all the testers 40, i.e., to all the pogo frames 70.

(Temperature Setting)

At the time of the electrical characteristic inspection, first, the set temperature of the wafer W is newly set or changed based on a user's operation or the like (step S1). The set temperature of the wafer W at the time of the electrical characteristic inspection is commonly applied to all areas 13*a*.

(Preliminary Temperature Control)

Prior to the electrical characteristic inspection, the preliminary temperature control of the probe card 80 is performed under the control of the controller 22 (step S2). Specifically, the controller 22 controls the temperature control mechanism 52 such that the temperature of the chuck top 51, which is coupled to the pogo frame 70 while the wafer W is not mounted thereon, is adjusted to the set temperature of the wafer W at the time of the electrical characteristic inspection. The temperature of the probe card 80 is controlled by heating or cooling using the temperature-controlled chuck top 51. At the time of the temperature control, the probe card 80 is heated or cooled by radiation in a state where the chuck top 51 and the probes 82 are separated from each other. Alternatively, the probe card 80 may be heated or cooled by the radiation and heat transfer through the probes 82 in a state where the chuck top 51 is in contact with the probes 82.

(Electrical Resistance Measurement)

During the temperature control of the probe card 80, the electrical resistance of the short-circuit line 83 is measured by the tester 40 (step S3). For example, the electrical resistance is measured by an electrical resistance measuring circuit disposed at the tester motherboard 41 of the tester 40.

(Determination)

The tester 40 determines whether or not the temperature of the probe card 80 is stable, i.e., whether or not the tip ends of the probes 82 are positionally stable based on the electrical resistance measurement result (step S4). For example, when the absolute value of the amount of changes in the measured resistivity per unit time is smaller than or equal to a threshold, it is determined that the tip ends of the probes 82 are positionally stable.

Alternatively, it is possible to calculate the temperature of the short-circuit line 83 based on the electrical resistance measurement result and estimate the calculated temperature as the temperature of the probe card 80. Then, it is determined whether or not the temperature of the probe card 80 has reached a predetermined temperature based on the estimated temperature, and it is determined that the tip ends of the probes 82 are positionally stable when the temperature of the probe card 80 has reached the predetermined temperature.

If it is determined that the tip ends of the probes 82 are not positionally stable (NO in step S4), the processing returns to step S2, and the preliminary temperature control of the probe card 80 is continued.

On the other hand, if it is determined that the tip ends of the probes 82 are positionally stable (YES in step S4), the preliminary temperature control of the probe card 80 is completed.

(Alignment)

After the temperature control of the probe card 80, the position alignment between the wafer W as an inspection target and the probe card 80 is performed (step S5). Specifically, the controller 22 controls the transfer unit 30 so that the wafer W can be extracted from the cassette C in the port 20 of the loading/unloading area 11, loaded into the inspection area 13, and mounted on the chuck top 51 on the aligner 50. Next, the controller 22 controls the aligner 50 and the cameras 60 and 61 so that the wafer W on the chuck top 51 and the probe card 80 can be position-aligned in a horizontal direction based on the imaging result of the wafer W obtained by the camera 60 and the imaging result of the probes 82 obtained by the camera 61. Next, the chuck top 51 is raised until the probes 82 of the probe card 80 are brought into contact with the electrodes of the semiconductor devices formed on the wafer W. Thereafter, in a state where the probes 82 are in contact with the electrodes, a vacuum mechanism (not shown) is driven and the aligner 50 is lowered. Accordingly, the chuck top 51 is separated from the aligner 50 and coupled to the pogo frame 70.

Further, before the probes 82 are brought into contact with the electrodes of the semiconductor devices, the controller 22 controls the temperature control mechanism 52 so that the temperature of the wafer W can be controlled to the set temperature of the wafer W at the time of the electrical characteristic inspection.

When the camera 61 captures the image of the probes 82, the image of the probes 82 is captured multiple times so that the determination on whether or not the tip ends of the probes 82 are positionally stable in practice can be performed based on the imaging results. When it is determined that the tip ends of the probes 82 are not positionally stable in practice, the inspection process may be stopped.

(Inspection)

After the position-alignment, the electric signals for the electrical characteristic inspection are inputted from the tester 40 to the probes 82 through the pogo pins 71 and the like, and the electric characteristic inspection of the electronic devices is started (step S6). During the inspection, the controller 22 controls the temperature control mechanism 52 so that the temperature of the wafer W mounted on the chuck top 51 can be controlled to the set temperature.

The electrical resistance of the short-circuit line 83 may be measured during the electrical characteristic inspection. The tester 40 and the controller 22 can determine whether or not the temperature of the probe card 80 has changed due to abnormal heat generation of the semiconductor devices based on the electrical resistance measurement result. The abnormal heat generation is caused, for example, when a short circuit occurs in the semiconductor devices.

Upon completion of the electrical characteristic inspection, the controller 22 controls the aligner 50, the transfer unit 30, and the like to return the wafer W to the cassette C in the port 20.

While the inspection is being performed in one tester 40, the transfer or the removal of a wafer W to or from another tester 40 may be performed by the aligner 50.

As described above, in the present embodiment, the inspection device 1 includes the probe card 80 having the probes 82 to be in contact with the wafer W and the testers 40 configured to transmit and receive electric signals for the inspection between the wafer W and the probe card 80 through the probes 82. The inspection device 1 further includes a pair of pogo pins 71 that electrically connect the probe card 80 with the tester 40, and the short circuit line 83 formed at the probe card 80 and serving as an electrical resistor between the pogo pins 71. In the inspection device 1, the tester 40 is configured to measure the electrical resistance of the short-circuit line 83 based on the electric signals transmitted through the pogo pins 71. The electrical resistance increases and decreases due to expansion/contraction of the probe card 80 caused by the changes in temperature of the probe card 80, and due to the changes in the electrical resistivity. Therefore, in the present embodiment, the temperature stability of the probe card 80, i.e., the positional stability of the tip ends of the probes 82 can be determined based on the electrical resistance measurement result. Further, since the resistor such as the short-circuit line 83 has a simple structure, the short-circuit line 83 can be formed at the probe card 80 even when the multiple probes 82 are arranged on the probe card 80. In other words, in the present embodiment, even when the probe card 80 has the multiple probes 82, it is possible to determine whether or not the tip ends of the probe 82 are positionally stable during the preliminary temperature control of the probe card 80.

Further, in the present embodiment, since it is possible to determine the positional stability of the tip ends of the probes, it is not necessary to have such a long period of time for the preliminary temperature control of the probe card 80 as in the conventional case. Thus, the throughput of the electrical characteristic inspection can be improved.

The short-circuit line 83 can be formed when the electrode pads P are formed.

Thus, the manufacturing process of the probe card 80 is not complicated since it is not necessary to install certain elements.

In the present embodiment, the length of the short-circuit line 83 is longer than the shortest distance $L_0$ between the ends of the pogo pins 71 on the probe card 80 side. Therefore, the short-circuit line 83 has a large electrical resistance, and the change of the electrical resistance of the short-circuit line 83 is considerable in response to the extension/contraction of the probe card 80. Accordingly, it is possible to more accurately determine the positional stability of the tip ends of the probes 82.

In the present embodiment, as described above, the temperature of the probe card 80 may be estimated based on the measured electrical resistance of the short-circuit line 83.

In the above description, the short-circuit line 83 is formed, e.g., in the central area where the electrode pads P are formed on the top surface of the card main body 81 of the probe card 80. However, the short-circuit line 83 may be formed in a peripheral area surrounding the central area on the top surface of the card main body 81.

Figure 9:
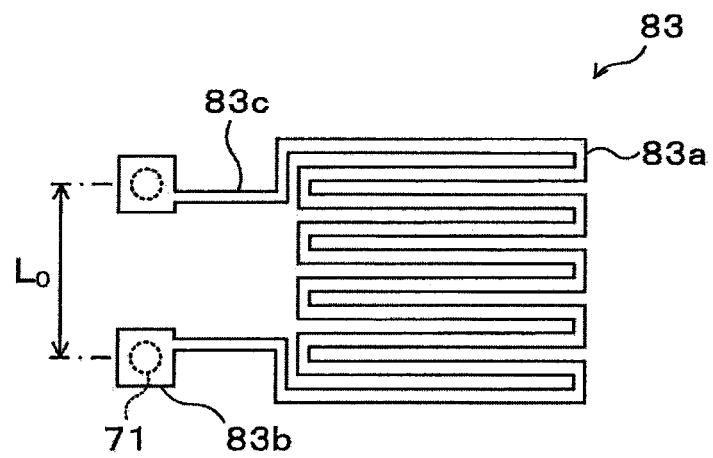
FIGS. 9 to 12 are plan views showing other examples of the short-circuit line.

FIG. 9 is a plan view showing an example of the short-circuit line 83 formed in the peripheral area.

As shown in FIG. 9, the short-circuit line 83 formed in the peripheral area has a connection pattern 83*c* for connecting the folding pattern 83*a* with the electrode pad 83*b*. The folding pattern 83*a* of the short-circuit line 83 formed in the peripheral area can be greater in size than that of the short-circuit line 83 formed in the central area. For example, the folding pattern 83*a* of the short-circuit line 83 formed in the peripheral area can be formed in an area of 5×5 mm in the plan view. Therefore, the short-circuit line 83 can be increased in size, thereby increasing the electrical resistance thereof.

It is preferred that the short-circuit line 83 has a large electrical resistance. This is because when the short-circuit line 83 has a large electrical resistance, the determination of the positional stability of the tip ends of the probes 82 based on the electrical resistance measurement result can be more accurately performed. Further, when the short-circuit line 83 has a large electrical resistance, the ratio of the changes in the electrical resistance to the changes in the temperature of the short-circuit line 83 becomes greater. Therefore, the electrical measurement circuit for measuring the electrical resistance does not require a high measurement accuracy.

Figure 10:
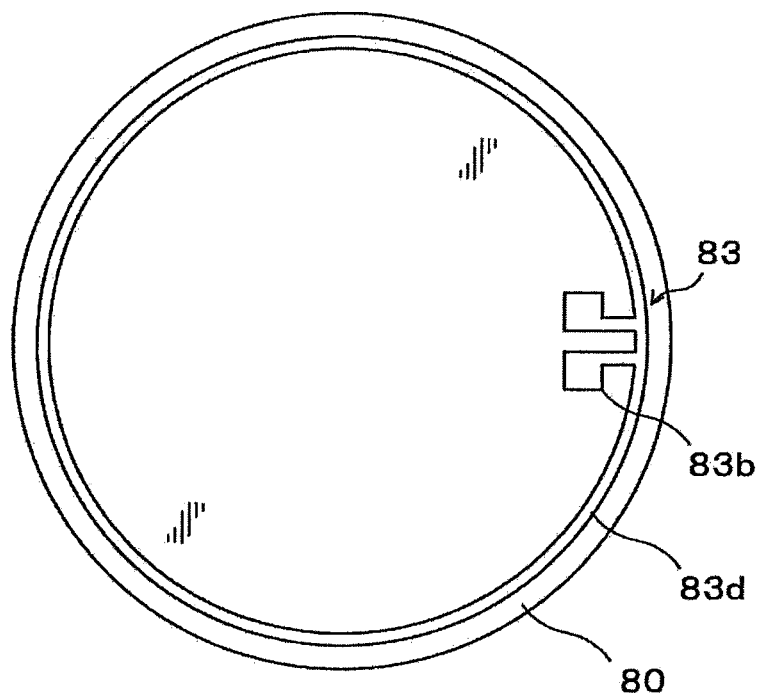

FIG. 10 is a plan view showing another example of the short-circuit line 83 disposed in the peripheral region.

In FIG. 10, the short-circuit line 83 has a circumferential pattern 83*d* extending in the circumferential direction of the probe card 80. In this example, the length of the short-circuit line 83 of this example can be increased with a simple shape and the electrical resistance of the short-circuit line 83 can be increased.

When the short-circuit line 83 is a copper pattern having a width of 25 μm, a thickness of 10 μm, and a length of 150 mm, the electrical resistance thereof is about 9.3 μΩ at room temperature (25° C.) and the temperature coefficient of the electrical resistance (the rate of increase in the electrical resistance with respect to the temperature) is 0.04Ω/° C.

In the above description, the number of the short-circuit line 83, specifically, the number of a set of the short-circuit line 83 and a pair of pogo pins 71 short-circuited by the short-circuit line 83 (hereinafter, referred to as "line and pin set") is one. However, more than one set may be provided. When multiple line and pin sets are provided, the probe card 80 is divided into multiple areas, and the line and pin set is provided in each area. By providing the multiple line and pin sets, it is possible to obtain the in-plane tendency of the temperature of the probe card 80 based on the electrical resistance measurement result of each line during the preliminary temperature control. Further, the multiple line and pin sets may be provided in the central area and the peripheral area of the card main body of the probe card 80. Accordingly, it is possible to detect the temperature changes in both of the central portion and the peripheral portion of the probe card 80.

When the multiple line and pin sets are provided in the respective areas as described above, the following effects can be obtained by measuring the electrical resistance of the short-circuit line 83 during the electric characteristic inspection. In other words, the temperature of the wafer W is reflected on the probe card 80 by the heat transfer from the wafer W, so that the in-plane tendency of the temperature of the wafer W during the electrical characteristic inspection can be obtained based on the electrical resistance measurement result.

When the in-plane tendency of the temperature of the probe card 80 is obtained as described above, the temperature of the probe card 80 may be locally controlled based on the in-plane tendency. The local temperature control can be performed by, e.g., the temperature control mechanism 52 of the chuck top 51.

As described above, when the in-plane tendency of the temperature of the wafer W during the electrical characteristic inspection is obtained based on the electrical resistance measurement result of the short-circuit line 83, the temperature control mechanism 52 may locally control the temperature of the wafer W based on the in-plane tendency.

Figure 11:
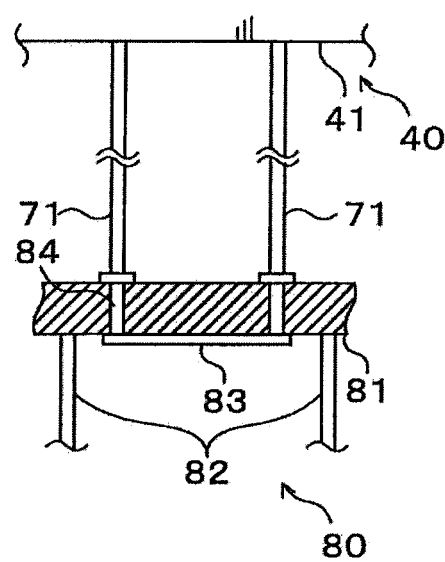

In the above description, the short-circuit line 83 is formed on the top surface of the card main body 81 of the probe card 80, i.e., on the tester 40 side. However, as shown in FIG. 11, the short-circuit line 83 may be formed on the bottom surface of the card main body 81, i.e., on the probe 82 side. In this case, the short-circuit line 83 and the electrode pads P that are in contact with the pogo pins 71 are electrically connected through conductive members 84 penetrating through the card main body 81 of the probe card 80 in a thickness direction (vertical direction in FIG. 11). By providing the short-circuit line 83 on the bottom surface of the card main body 81, the distance between the short-circuit line 83 and the tip ends of the probes 82 becomes shorter, which makes it possible to more accurately determine whether or not the tip ends of the probes 82 are positionally stable.

Figure 12:
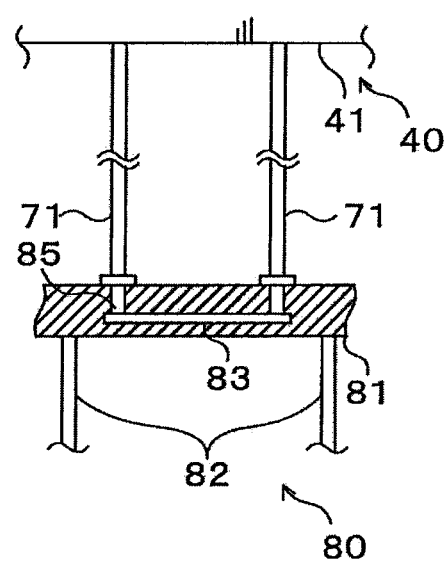

Since the card main body 81 is a laminated substrate, the short-circuit line 83 may be disposed inside (between layers of) the card main body 81 as shown in FIG. 12. In this case, the short-circuit line 83 and the electrode pads P that are in contact with the pogo pins 71 are electrically connected through conductive members 85 extending in the thickness direction (vertical direction in FIG. 12) inside the card main body 81.

The short-circuit line 83 may be formed on at least one of the probe 82 side of the probe card 80, the tester 40 side of the probe card 80, or inside the card main body 81. Alternatively, the short-circuit line 83 may be formed on all of the probe 82 side, the tester 40 side, and inside the card main body 81. By forming the short-circuit line 83 on all of the probe 82 side, the tester 40 side, and inside the card main body 81, it is possible to determine the uniformity of the temperature of the probe card 80 in the vertical direction, i.e., in the thickness direction, or it is possible to obtain the tendency of the temperature of the probe card 80 in the vertical direction. When the short-circuit lines 83 are formed at multiple locations (e.g., on the probe 82 side and the tester 40 side), the temperatures of the portions of the probe card 80 where the short-circuit lines 83 are formed are estimated based on the electrical resistance measurement results, and the tip ends of the probes 82 are determined to be positionally stable when the temperatures of all of the portions have reached a predetermined temperature.

The pogo pins 71 may be Kelvin-connected to the short-circuit line 83. In other words, the pogo pins 71 connected to the short-circuit line 83 may include two pogo pins 71 serving as force lines through which a current flows and two pogo pins 71 serving as sense lines for measuring a voltage. When the pogo pins 71 are Kelvin-connected to the short-circuit line 83, the electrical resistance can be accurately measured even when the electrical resistance of the short-circuit line 83 is small.

Further, the tester 40 may estimate the temperature of the probe card 80 based on the electrical resistance measurement result of the short-circuit line 83 and predict the state of the member(s) disposed around the probe card 80 (the pogo frame 70 in the following example) based on the estimation result. Specifically, the tester 40 performs the following processes.

For example, there are various types of probe cards 80, and the probe cards 80 may have different thermal conductivities. If the probe cards 80 have different thermal conductivities, the temporal change in the temperature of each probe card 80 during the preliminary temperature control of the pogo frame 70 is also different. Further, if the probe cards 80 have different thermal conductivities, the final temperature of the pogo frame 70 disposed around each probe card 80 after the preliminary temperature control is also changed. Further, the shape of the pogo frame 70 is changed depending on the temperature.

Therefore, the tester 40 may obtain the temporal change in the temperature of the probe card 80 during the preliminary temperature control of the pogo frame 70 based on the electrical resistance measurement result of the short-circuit line 83 and predict the state of the pogo frame 70, i.e., the temperature and the shape of the pogo frame 70, based on the obtained temporal variation. The data indicating the relationship between the electrical resistance measurement result and the state of the pogo frame 70 is obtained in advance.

Further, the tester 40 may control the state of the pogo frame 70 based on the predicted state of the pogo frame 70 (i.e., the member around the probe card 80). For example, the tester 40 may control the temperature of the pogo frame 70 based on the predicted temperature of the pogo frame 70, and may control the tilting, i.e., the level, of the pogo frame 70 based on the predicted shape of the pogo frame 70. The temperature of the pogo frame 70 is controlled using, e.g., a frame temperature control mechanism (not shown) attached to the pogo frame 70. The tilting of the pogo frame 70 is controlled using a tilting adjustment mechanism (not shown) that can be applied to the pogo frame 70.

Further, in the above description, the tester 40 determines whether or not the tip ends of the probes 82 are positionally stable. However, the determination may be made by the controller 22.

The embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

The following configurations are included in the technical scope of the present disclosure.

(1) There is provided an inspection device for inspecting an inspection target substrate, including: a probe card having probes to be in contact with the inspection target substrate; a tester configured to transmit and receive electric signals for an inspection to and from the inspection target substrate through the probes; a plurality of conductive lines that electrically connect the probe card with the tester, at least a part of the conductive lines being electrically connected to the probes; and at least one resistor formed at the probe card and serving as an electrical resistor. The tester is further configured to measure a resistance of the at least one resistor based on the electric signals transmitted and received through the conductive lines.

With the configuration (1), even when the probe card has multiple probes, it is possible to determine whether or not the tip ends of the probes are positionally stable during the preliminary temperature control.

(2) In the inspection device of the configuration (1), the tester may be further configured to determine whether or not the probes are positionally stable based on a measurement result of the resistance.

(3) In the inspection device of the configuration (1) or (2), the tester may be further configured to estimate a temperature of the probe card based on a measurement result of the resistance.

(4) In the inspection device of any one of the configurations (1) to (3), the at least one resistor may be formed on at least one of the probe side of the probe card, the tester side of the probe card, or inside the probe card.

(5) In the inspection device of any one of the configurations (1) to (4), the at least one resistor may include two or more resistors.

(6) In the inspection device of the configuration (5), the probe card may be divided into a plurality of areas and the two or more resistors may be respectively disposed in the divided areas of the probe card.

With the configuration (6), it is possible to obtain the in-plane tendency of the temperature of the probe card during the preliminary temperature control.

(7) In the inspection device of any one of the configurations (1) to (6), the at least one resistor may be a short-circuit line configured to short-circuit a pair of the conductive lines and the short-circuit line has a linear and thin film shape.

(8) In the inspection device of the configuration (7), a length of the short-circuit line may be greater than a distance between ends of the pair of the conductive lines on the probe card side.

With the configuration (8), the short-circuit line has a large electrical resistance, so that it is possible to more accurately determine the positional stability of the tip ends of the probes.

(9) In the inspection device of the configuration (8), the short-circuit line may be repeatedly extended and folded in a radial direction of the probe card.

With the configuration (9), even if the temperature of the probe card is slightly changed during the preliminary temperature control, the length of the short-circuit line and the electrical resistance of the short-circuit line are considerably changed. Therefore, the determination of the positional stability of the tip ends of the probes based on the electrical resistance measurement result can be more accurately carried out.

(10) In the inspection device of any one of the configurations (1) to (9), the tester may be further configured to predict a state of a member disposed around the probe card based on a measurement result of the resistance.

(11) In the inspection device of the configuration (10), the tester may be further configured to control the member based on the predicted state of the member.

(12) There is provided a method of controlling a temperature of a probe card provided in an inspection device for inspecting an inspection target substrate before an inspection is performed, the inspection device including: a tester configured to transmit and receive electric signals for the inspection to and from the inspection target substrate through probes of the probe card; a plurality of conductive lines that electrically connect the probe card with the tester, at least a part of the conductive lines being electrically connected to the probes; and a resistor formed at the probe card and serving as an electrical resistor. The method includes heating or cooling the probe card; measuring a resistance of the resistor based on the electric signals transmitted and received through the conductive lines; and determining whether or not a temperature of the probe card is stable based on a measurement result of the resistance.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. An inspection device for inspecting an inspection target substrate, comprising:
    a probe card having probes to be in contact with the inspection target substrate;
    a tester configured to transmit and receive electric signals for an inspection to and from the inspection target substrate through the probes;
    a plurality of conductive lines that electrically connect the probe card with the tester, at least a part of the conductive lines being electrically connected to the probes; and
    a resistor configured to short-circuit a pair of the conductive lines and serve as an electrical resistor,
    wherein the tester is further configured to measure a resistance of the resistor between the pair of the conductive lines before the inspection is performed.

2. The inspection device of claim 1, wherein the tester is further configured to determine whether or not the probes are positionally stable based on a measurement result of the resistance.

3. The inspection device of claim 1, wherein the tester is further configured to estimate a temperature of the probe card based on a measurement result of the resistance.

4. The inspection device of claim 1, wherein the resistor is formed on at least one of the probe side of the probe card, the tester side of the probe card, or inside the probe card.

5. The inspection device of claim 1, wherein the probe card is divided into a plurality of areas and the resistor is disposed in each of the divided areas of the probe card.

6. The inspection device of claim 1, wherein the resistor is a short-circuit line configured to short-circuit the pair of the conductive lines and the short-circuit line has a linear and thin film shape.

7. The inspection device of claim 6, wherein a length of the short-circuit line is greater than a distance between ends of the pair of the conductive lines on the probe card side.

8. The inspection device of claim 7, wherein the short-circuit line is repeatedly extended and folded in a radial direction of the probe card.

9. The inspection device of claim 1, wherein the tester is further configured to predict a state of a member disposed around the probe card based on a measurement result of the resistance.

10. The inspection device of claim 9, wherein the tester is further configured to control the member based on the predicted state of the member.

11. A method of controlling a temperature of a probe card provided in an inspection device for inspecting an inspection target substrate before an inspection is performed, wherein the inspection device includes:

a tester configured to transmit and receive electric signals for the inspection to and from the inspection target substrate through probes of the probe card;

a plurality of conductive lines that electrically connect the probe card with the tester, at least a part of the conductive lines being electrically connected to the probes; and a resistor configured to short-circuit a pair of the conductive lines and serves as an electrical resistor, the method comprising:

heating or cooling the probe card;

measuring a resistance of the resistor between the pair of the conductive lines; and determining whether or not a temperature of the probe card is stable based on a measurement result of the resistance.

* * * * *